US007381943B2

United States Patent
Lee et al.

(10) Patent No.: US 7,381,943 B2
(45) Date of Patent: Jun. 3, 2008

(54) NEUTRAL PARTICLE BEAM PROCESSING APPARATUS

(75) Inventors: Bong-Ju Lee, Taejeon (KR); Suk-Jae Yoo, Taejeon (KR); Hag-Joo Lee, Seoul (KR)

(73) Assignees: Korea Basic Science Institute, Daejeon (KR); SEM Technology, Co., Ltd., Seoul (KR)

( * ) Notice: Subject to any disclaimer, the term of this patent is extended or adjusted under 35 U.S.C. 154(b) by 205 days.

(21) Appl. No.: 10/580,476

(22) PCT Filed: Nov. 27, 2004

(86) PCT No.: PCT/KR2004/003099

§ 371 (c)(1),
(2), (4) Date: May 24, 2006

(87) PCT Pub. No.: WO2005/053365

PCT Pub. Date: Jun. 9, 2005

(65) Prior Publication Data

US 2007/0084991 A1    Apr. 19, 2007

(30) Foreign Application Priority Data

Nov. 27, 2003  (KR) ............ 10-2003-0084946

(51) Int. Cl.
*H01S 1/00* (2006.01)
*H01S 3/00* (2006.01)
*H05H 3/02* (2006.01)

(52) U.S. Cl. ............ 250/251; 250/423 R; 250/427; 250/234; 250/306; 250/492.2; 250/492.3; 250/492.22; 438/708; 438/798; 438/396; 438/696; 156/345.34; 430/323

(58) Field of Classification Search ........... 250/251, 250/423 R, 427, 234, 306, 307, 492.2, 492.3, 250/492.22; 438/708, 798, 396, 696; 156/345.34; 430/323
See application file for complete search history.

(56) References Cited

U.S. PATENT DOCUMENTS

| 5,462,629 | A | * | 10/1995 | Kubota et al. ......... 156/345.55 |
| 5,818,040 | A | | 10/1998 | Kinoshita et al. |
| 6,935,269 | B2 | | 8/2005 | Lee et al. |
| 7,314,574 | B2 | * | 1/2008 | Ichiki et al. ................ 216/67 |

FOREIGN PATENT DOCUMENTS

| EP | 0 443 154 A2 | 12/1990 |
| EP | 0 658 917 | 12/1994 |
| WO | WO 2004/036611 | 4/2004 |

* cited by examiner

*Primary Examiner*—Jack I. Berman
*Assistant Examiner*—Meenakshi S Sahu
(74) *Attorney, Agent, or Firm*—Hoffman & Baron, LLP

(57) ABSTRACT

The present invention relates to a neutral particle beam processing apparatus. More specifically, the present invention relates to a neutral particle beam processing apparatus comprising a plasma discharging space inside which processing gases are converted to plasma ions through a plasma discharge, a heavy metal plate which converts the plasma ions into neutral particles through collisions, a plasma limiter which prevents plasma ions and electrons from passing through and allows the neutral particles produced by collisions of the plasma ions with the heavy metal plate to pass through, and a treating housing inside which a substrate to be treated is located, wherein the plasma discharging space is sandwiched between the heavy metal plate and the plasma limiter.

15 Claims, 4 Drawing Sheets

NEUTRAL PARTICLE BEAM PROCESSING APPARATUS

TECHNICAL FIELD OF THE INVENTION

The present invention relates to a surface processing apparatus. More specifically, the present invention relates to a neutral particle beam processing apparatus which treats a surface of a substrate with neutral particle beams.

BACKGROUND OF THE INVENTION

Plasma is a group of charged protons and electrons generated through a discharge, and is being widely used in treating a surface of a substrate in a semiconductor manufacturing process, such as plasma etch and PECVD (Plasma Enhanced-Chemical Vapor Deposition). Nevertheless, the plasma processing method had suffered from a disadvantage that the plasma is a charged particle. For instance, use of charged particles for etching often tends to alter etch profile, damage a circuit formed on the substrate, or lead to voltage gradients which may damage the surface of a substrate.

To overcome such a problem caused by the plasma processing method, systems using neutral particles are suggested. There are two main techniques to produce neutral particles from plasma. One is a charge exchange which produces neutral particles by collisions of the plasma with gas particles. The other is to produce the neutral particles by collisions of the plasma with a heavy metal plate. As an example of the former technique, Japanese patent Nos. 2,606,551 and 2,842,344 may be mentioned as a reference. However, the neutral particles produced through the charge exchange between the plasma and the gas particles had drawbacks that the efficiency of transformation to neutral particles is low and that the directionality of neutral particles and colliding frequency are hard to control. Therefore, the technique to produce neutral particles by collisions of plasma ions with the heavy metal plate is believed to be more desirable.

U.S. Pat. No. 4,662,977 discloses a neutral particle beam processing apparatus for treating a surface of a substrate, comprising a plasma gun which produces plasma and directs the produced plasma to a predetermined direction, and a heavy metal plate which converts plasma ions to neutral particles and redirects the neutral particles to the substrate. The system has an advantage of solving drawbacks of the plasma, but is not suitable for treating the surface of a substrate having a size of 8 inches or more, due to a small cross section of the incident neutral particle beams.

WO 01/84611 filed by the present inventors discloses an apparatus for treating surfaces with neutral particle beams, comprising a high frequency electric power introducing part, a plasma generating part, a neutral particle generating part and a treating part that loads the target substrate. In the apparatus, high frequency electric power is introduced through the high frequency electric power introducing part, gases introduced into the plasma generating part are converted to plasma with the high frequency electric power, the plasma generated inside the plasma generating part are transformed into neutral particles through collisions of the plasma with a heavy metal plate, and the neutral particles thus generated are used to treat the surface of a substrate. An advantage of the neutral particle beam processing apparatus is a generation of uniform plasma that enables to treat targets with comparatively larger areas. Unpublished PCT application, PCT/KR03/02146, discloses a modified neutral particle beam processing apparatus that improves the conversion performance from plasma to neutral particle beams by forming inclined slits or inclined holes within the heavy metal plate to increase the number of plasma collisions to the heavy metal plate, and thereby improving the efficiency of surface treatment of targets. Herein, the inclined slits or inclined holes formed on the heavy metal plate guarantee the collisions of the plasma with the heavy metal plate and prevent plasma and electrons to reach the substrate. The neutral particle beam processing apparatus has advantages that, for example, a plasma discharging space guarantees uniform plasma generation with wider area, and that the effects caused by plasma ions and electrons unconverted to neutral particle is minimized, and that a highly directional neutral particle beams are produced. Nevertheless, according to the neutral particle beam processing apparatus, plasma sheath occurs within the inclined slits or inclined holes and interferes with the production of neutral particles. In other words, the direction of the plasma ions is interrupted by the imperfect sheath formed at the inclined slits or inclined holes and a large number of neutral particles from plasma ions is not reachable to the target.

DISCLOSURE OF THE INVENTION

Technical Object

As a result of profound researches of our inventors to overcome problems stated above, it has been found that a system in which, between a means for producing neutral particles (specifically, a heavy metal plate) and a means for preventing plasma ions and electrons, which are not converted to neutral particles, from reaching a substrate (specifically, a plasma limiter), a plasma discharging space is located, is preferable. The first object of the present invention is to provide a neutral particle beam processing apparatus comprising a plasma discharging space inside which processing gases are converted to plasma ions through a plasma discharge, a heavy metal plate which converts the plasma ions into neutral particles through collisions, a plasma limiter which prevents plasma ions and electrons from passing through and allows only the neutral particles produced by collisions of the plasma ions with the heavy metal plate to pass through, and a treating housing inside which a substrate to be treated is located, wherein the plasma discharging space is sandwiched between the heavy metal plate and the plasma limiter. The conversion to neutral particles is simplified and the interruption by the plasma ions and the electrons is easily prevented by separated positioning of the part for converting plasma ions which are generated in the plasma discharging space to neutral particles, with the part for selectively preventing plasma ions and electrons formed in the plasma discharging space from passing through, by the plasma discharging space located between them.

Technical Solution

According to the neutral particle beam processing apparatus of the present invention, the heavy metal plate is located above the plasma discharging space, and a plasma limiter is located below the plasma discharging space. Plasma ions generated in the plasma discharging space are directed to the heavy metal plate by a bias voltage, and undergoes collisions with the heavy metal plate to produce neutral particles, and then the produced neutral particles enter the plasma limiter.

The neutral particle beam processing apparatus according to the present invention further comprises a collimator, which collimates the neutral particles which had passed through the plasma limiter, as needed.

According to preferred embodiment of the present invention, there is provided a neutral particle beam processing apparatus, comprising: a) a reaction chamber with an opened lower part, comprising an inner space, an gas inlet port and an gas outlet port installed at a side of the reaction chamber, and a heavy metal plate, wherein the inner space of the reaction chamber is a plasma discharging space and the heavy metal plate is installed above the plasma discharging space, processing gases introduced into the plasma discharging space through the gas inlet port being converted into plasma ions through a plasma discharge and then the plasma ions being converted into neutral particles by collisions with the heavy metal plate; b) a plasma limiter located below the reaction chamber comprising holes or slits to pass the neutral particles through while interrupting the plasma ions and electrons from passing through; and c) a treating housing located below the plasma limiter inside which a substrate to be treated with the neutral particles is located.

According to another preferred embodiment of the present invention, there is provided a neutral particle beam processing apparatus, further comprising a magnetic unit to impress magnetic field or an electric unit to impress electric field to the holes or slits of the plasma limiter.

According to further another preferred embodiment of the present invention, there is provided a neutral particle beam processing apparatus, further comprising a collimator to collimate the neutral particles which had passed through the plasma limiter at between the plasma limiter and the treating housing.

According to yet another preferred embodiment of the present invention there is provided a neutral particle beam processing apparatus, further comprising a collimator with holes so that the neutral particles are collimated by the holes.

According to yet another preferred embodiment of the present invention there is provided a neutral particle beam processing apparatus, wherein the heavy metal plate is formed as an inner upper wall of the reaction chamber or additionally installed at above the plasma discharging space.

ADVANTAGEOUS EFFECT OF THE INVENTION

The neutral particle processing apparatus according to the present invention has a more simplified structure than the conventional apparatuses. For instance, the apparatuses disclosed in WO 01/84611 and PCT/KR03/02146 had complicatedly structured reflecting panels in order to achieve conversion of plasma ions into neutral particles and exclusion of interference by plasma ions and electrons. To the contrary, the neutral particle processing apparatus according to the present invention does not require such a structure. Further, reduction of the efficiency for the production of neutral particles which had been occurred in the conventional apparatuses does not occur in the present invention. The heavy metal plate which converts plasma ions into neutral particles and the plasma limiter which allows the neutral particles to passing through and prohibits the plasma ions and electrons from passing through are separated by the plasma discharging space which positioned between them. Therefore, the conversion to neutral particles could be simplified and the interruption caused by the plasma ions and the electrons are easily prevented and, as a result, the conversion efficiency to the neutral particles and the surface treatment efficiency of a substrate are remarkably improved.

Especially, the neutral particle processing apparatus according to the present invention could perform lithography by choosing a proper collimator and using a mask such as a stencil mask. Two major advantages can be obtained by the neutral particle lithography instead of photo lithography. Photo lithography is performed by consecutive processes comprising exposing a photoresist to light through a patterned mask followed by developing. Furthermore, in order to obtain tens of nanometer-scaled line width, new photo lithography should be developed because of the comparatively long wave length of light compared to the line widths required. However, the neutral particle lithography can simultaneously perform pattern formation and removal of the photoresist, by exposing radical neutral particle beams such as oxygen, which was generated from the neutral particle processing apparatus according to the present invention, onto the photoresist through a patterned mask, and, as a consequence, the processing efficiency could be enhanced. In addition, since the de Broglie wavelength of the neutral particle beam is very short (for instance, it is about 0.002 nm for oxygen atomic beam with 10 eV) and, as a result, there is no limit on focusing range rather than photo lithography, and the neutral particle beam could be applied to tens of nanometer lighography. According to actual experiments performed to remove photoresist using the neutral particle beam processing apparatus, about 30 nm/minute removal speed as obtained, which is approximately 4 fold improvement compared to that of PGT/KR03/02146.

MODE OF THE INVENTION

Figure 1:
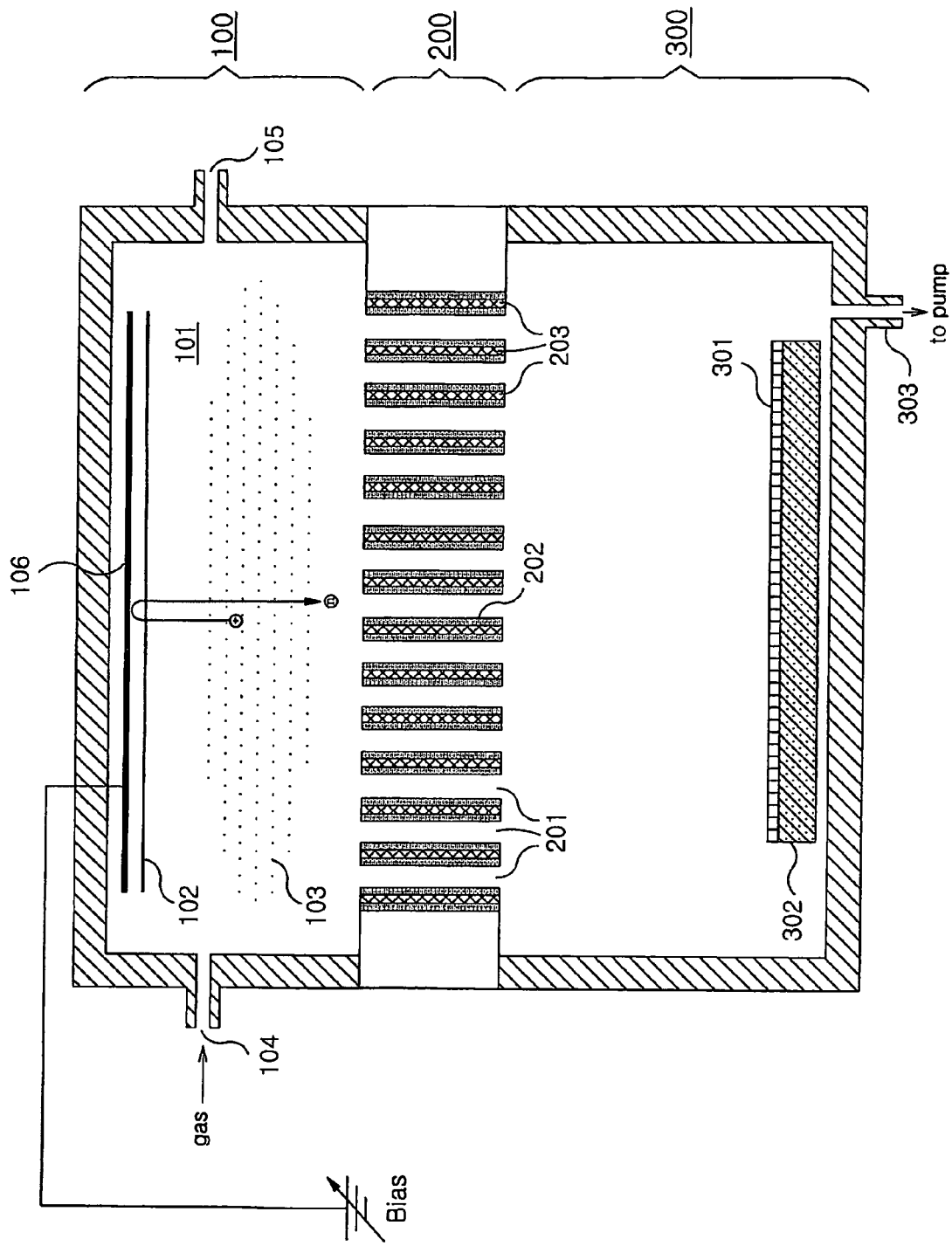
FIG. 1 is a cross-sectional view showing a preferred embodiment of the neutral particle beam processing apparatus in accordance with the present invention.

The present invention relates to a neutral particle beam processing apparatus, which comprises a plasma discharging space, a heavy metal plate, a plasma limiter, and a treating housing that loads substrate to be treated, wherein the plasma discharging space is sandwiched between the heavy metal plate and the plasma limiter.

Inside the plasma discharging space, processing gases introduced are converted to plasma through a plasma discharge. In other words, plasma, as a group of plasma ions (or positive ions) and electrons, is generated in the plasma discharging space. At this point, the plasma could be generated through various methods. For instance, a capacitively coupled plasma discharge, an inductively coupled plasma discharge, a helicon discharge using plasma wave, and a microwave plasma discharge can be applied. The inductively coupled plasma discharge which generates high density plasma under low operating pressure is desirable among them. Concerning the shapes of antenna used for the inductive coupled plasma discharge, please refer to Korean Patent Application Nos. 7010807/2000, 14578/1998, 35702/1999 and 43856/2001.

The plasma ions produced inside the plasma discharging space are converted into neutral particles by collisions with the heavy metal plate. As used herein, the term "a heavy metal plate" should be understood as a plate composed of, or coated on to a plate with, a heavy metal whose molecular weight is substantially heavier than that of the gases. Preferably, the surface of the heavy metal plate, where the plasma ions collide, is polished in order to guarantee elastic collisions. Examples of heavy metals to be used are Tantalum (Ta), Molybdenum (Mo), Tungsten (W), Gold (Au), Platinum (Pt), Stainless steel or alloys thereof. Contrary to that of WO 01/84611 and the Korean patent 2002-62648, the heavy metal plate does not required any holes for the pathway of neutral particles. That is because, although the heavy metal plate collides with plasma ions and converts them to neutral particles, it does not function as a pathway for the produced neutral particles. The neutral particles produced by collisions with the heavy metal plate are reflected, and enter into the plasma limiter via the plasma discharging space which positioned between the heavy metal plate and the plasma limiter.

The plasma limiter interrupts the plasma ions and the electrons from passing through and selectively allows the neutral particles to pass through. A negative limiting having holes or slits installed to limit the plasma ions and the electrons from passing through, or a positive limiting in which magnetic or electric field is impressed on the holes and slits to control the moving direction of the charged plasma ions or electrons could be used. The neutral particles, which had passed through the plasma limiter, collide with a substrate located inside the treating housing and perform surface treatment including, for example, removal of organic materials or photo-resist from the substrate.

In order to achieve adequate surface treatment, the directionality of neutral particles needs to be suitably controlled. For instance, to form a predetermined pattern on a surface by the surface treatment, the directionality of neutral particles is very important. In this case, it is desirable to additionally install a collimator, which collimates the direction of neutral particles, between the plasma limiter and the processing space. The collimator has multi holes to give fixed directionality.

The surface processing apparatus according to the present invention can be applicable to various semiconductor processing such as ashing, formation of oxidized film, and cleaning. As used herein, the term "semi-conductor processing" means various processes performed to manufacture structures including semi-conductor apparatus, circuits or electrodes, which are connected to the semi-conductor, by forming semi-conducting layer, insulating layer or conducting layer with a predetermined pattern on a material to be processed such as semi-conductor wafer or liquid substrate In the following, the present invention will be more fully described referring to accompanying drawings.

FIG. 1 is a cross sectional view showing a preferred embodiment of the neutral particle beam processing in accordance with the present invention. The apparatus illustrated in FIG. 1 is comprised of a reaction chamber 100 with an opened lower part, a plasma limiter 200 located at the opened lower part of the reaction chamber 100 and a treating housing 300. The inner space of the reaction chamber is a plasma discharging space 101. An antenna 102 to supply high frequency energy is installed in the discharging space 101 and a gas inlet port 104 and a gas outlet port 105 are installed at a side of the reaction chamber 100. The reaction chamber 100 is operated as follows. First, processing gases are introduced into the plasma discharging space 101 through the gas inlet port 104 and the processing gases undergo a plasma discharge by the high frequency power supply supplied through the antenna 102 and is converted into plasma 103. The plus ions (plasma ions) of the generated plasma are directed to the heavy metal plate 106 located above the plasma discharging space 101, and there, the plasma ions collide with the heavy metal plate 106 and converts to neutral particles. Herein, the plasma ions could be easily directed to the heavy metal plate 106 by applying a minus bias voltage to the heavy metal plate 106.

When a minus bias voltage is impressed to the heavy metal plate 106, the plasma ions are directed to the heavy metal plate 106 substantially or perfectively perpendicularly and collide with the heavy metal plate 106. The surface of the heavy metal plate 106, where plasma ions collide, may be polished to improve conversion efficiency to neutral particles and to prevent energy loss during the collisions. The neutral particles, produced by elastic collisions between the heavy metal plate 106 and the plasma ions, are reflected and enter into the plasma limiter 200 via the plasma discharging place 101.

The plasma limiter 200 has holes or slits 201. These holes or slits 201 allow the neutral particles to penetrate while interrupting the passage of the plasma ions and the electrons so that the neutral particles could pass through the plasma limiter 200 selectively and reach to the substrate 301 located in the treating housing 300. Although a material for the plasma limiter 200 is not specifically limited, a dielectric such as ceramic is desirable. The reason is that energy in the plasma ions and the electrons is absorbed when plasma ions and electrons collide with the side wall 202 of the plasma limiter 200 and thus, the adverse effects caused by the plasma ions and the electrons could be minimized. Meanwhile, the plasma limiter 200 may also collide with the neutral particles without definite directionality and absorb their energy so that any adverse effect caused by neutral particles without definite directionality can be also eliminated. The negative limiting of the plasma ions and the electrons by the holes or slits 201 is dependent upon the diameter and the depth of holes and slits 201, and such an adjustment should be suitably performed.

To prevent plasma ions and electrons from passing through the plasma limiter 200, a means 203 for applying magnetic or electric field to the plasma limiter 200 could be additionally installed at the plasma limiter 200. The means for applying magnetic or electric field 203 changes the moving direction of the plasma ions and the electrons, and further prevents them from reaching to the surface of a substrate. This limiting is called as "a positive limiting."

The neutral particles, which are protected from interruptions of the plasma ions and the electrons by "the negative limiting" or "the positive limiting," perform surface treatment of the substrate 301 installed inside the treating housing 300. For instance, the neutral particles collide with the residual products, which are absorbed or remained on a substrate (for instance, a wafer) 301, and remove them. At this point, the neutral particles are not charged particles and they cause no damage to the substrate 301. Meanwhile, the surface processing efficiency of the substrate 301 increases as the processing temperature is increased. Therefore, it is desirable to raise the surface temperature of the substrate by conduction or radiation. The unexplained reference number 302 is a target holder moving up and down by operation of an elevating device connected to a elevating axis (not shown) so that it can carry in the substrate 301 such as a wafer to be newly processed and carry out the processed substrate 301. Meanwhile, the target holder may be rotated by a motor (not shown). As a result, the rotation of the target holder 302 can prevent forming a blind spot caused by local introduction of the neutral particles onto the surface of the wafer. The unexplained reference number 303 is a gas outlet port connected to a vacuum pump (not shown) and maintains the inner pressure of the treating housing 300 at a range of about 1 mTorr.

The processing gases can be suitably chosen regarding the purpose of the surface treatment, which is well known to a person of ordinary to which the present invention pertains. For example, for cleaning organic substances from the substrate 301, it is preferred to use nitrogen gas, a mixture of nitrogen and oxygen, a mixture of nitrogen and an air, a rare gas or a mixture of nitrogen and a rare gas. From an economic point of view, nitrogen, a mixture of nitrogen and oxygen, a mixture of nitrogen and air are more preferable. For removing resists or etching organic films, it is preferred to use oxygen, ozone, an air, carbon dioxide ($CO_2$), a steam or nitric oxide ($N_2O$). In addition, for etching silicon, it is effective to use nitrogen or a rare gas in combination with a fluorine-based gas such as $CF_4$ or a chlorinated gas. For reducing metal oxides, it is possible to use a reducing gas such as hydrogen or ammonia.

Although FIG. 1 shows an example of plasma generation by the inductively coupling plasma discharge, a capacitatively coupled plasma discharge, a helicon discharge using plasma wave and a microwave plasma discharge could be widely applied, under the condition of in situ generation of plasma ions by a discharge in the plasma discharging space and neutral particles generation by collisions of the produced plasma particles with the heavy metal plate. Besides the various applications of the plasma discharging techniques, the plasma ions could be directed to the heavy metal plate 106 by applying a plus bias to the reaction chamber 100, instead of applying the minus bias to the heavy metal plate 106. Applying a minus bias directs the positively charged plasma ions to the heavy metal plate 106 by attraction. To the contrary, a plus bias directs the plasma ions to the heavy metal plate 106 by repulsion.

According to the neutral particle beam processing apparatus of the present invention, an additive gas may be additionally supplied into the treating housing 300 in combination with the neutral particles of the processing gases in order to assist surface treatment. This is specifically explained in PCT/KR03/02146.

Figure 2:
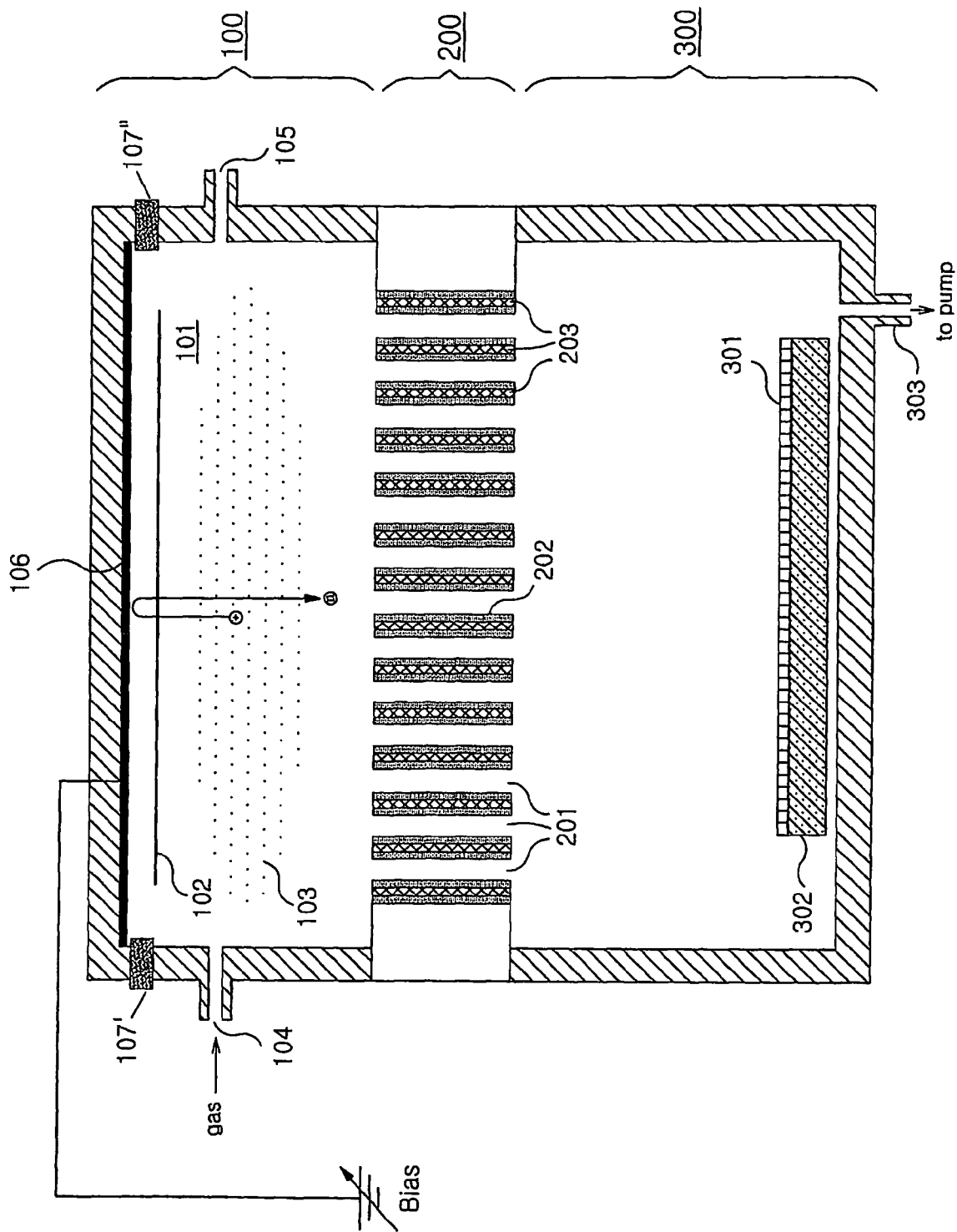
FIG. 2 is a cross-sectional view showing another preferred embodiment of the neutral particle beam processing apparatus in accordance with the present invention.

In the above, the neutral particle beam processing apparatus comprises the heavy metal plate 106 additionally installed above the plasma discharging space 101, but it is also possible to use the inner upper wall of the reaction chamber 100 as a heavy metal plate by being formed of a heavy metal or coating a heavy metal thereon. FIG. 2 shows such an example. In FIG. 2, instead of additionally installing the heavy metal plate 106, the inner upper wall of the reaction chamber 100 coated with a heavy metal is used as the heavy metal plate 106, and a minus bias is applied thereto. And the plasma 103 generated in the plasma discharging space 101 collides with the inner upper wall, having a heavy metal coating to act as a heavy metal plate 106, and produces neutral particles. Herein, the inner upper wall is insulated electrically with the other side walls of the reaction chamber 100 by insulators 107', 107". The reference numerals, which are not specifically explained, are same as the neutral particle beam processing apparatus shown in FIG. 1.

Figure 3:
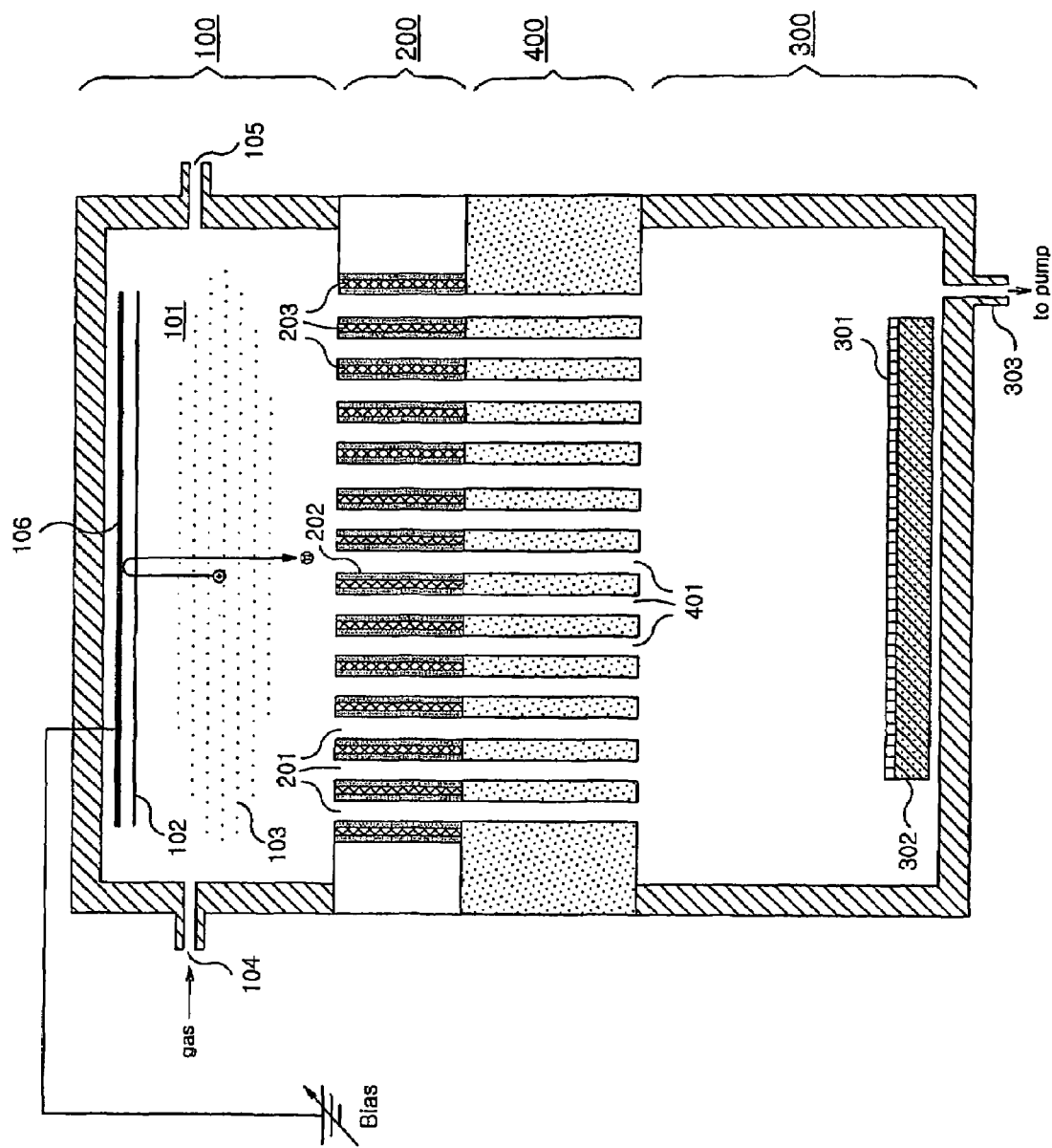
FIG. 3 is a cross-sectional view showing further another preferred embodiment of the neutral particle beam processing apparatus in accordance with the present invention.

FIG. 3 shows a further another preferred embodiment of the neutral particle beam processing apparatus in accordance with the present invention. The apparatus illustrated in FIG. 3 is comprised of a reaction chamber 100 with an opened lower part, a plasma limiter 200 located at the opened lower part of the reaction chamber 100, a treating housing 300 located below the plasma limiter 200 and a collimator 400 located between the plasma limiter 200 and the treating housing 300. Explanation to the reaction chamber 100, the plasma limiter 200 and the housing 300 is omitted because they are the same as those described in FIG. 1. The collimator 400, located between the plasma limiter 200 and the treating housing 300, collimates the neutral particles that passed through the plasma limiter 200 to improve the directionality of the neutral particles. The collimator 400 has multi holes 401. The neutral particles which had collided with the side wall 402 of the holes 401 more than once loose their energy during collision, and can no longer perform the role thereof. Therefore, of the neutral particles which had penetrated the collimator 400, the ones perpendicular to the holes 401 can be solely used. As thus, the directionality of the neutral particles is improved by the collimator 400.

Figure 4:
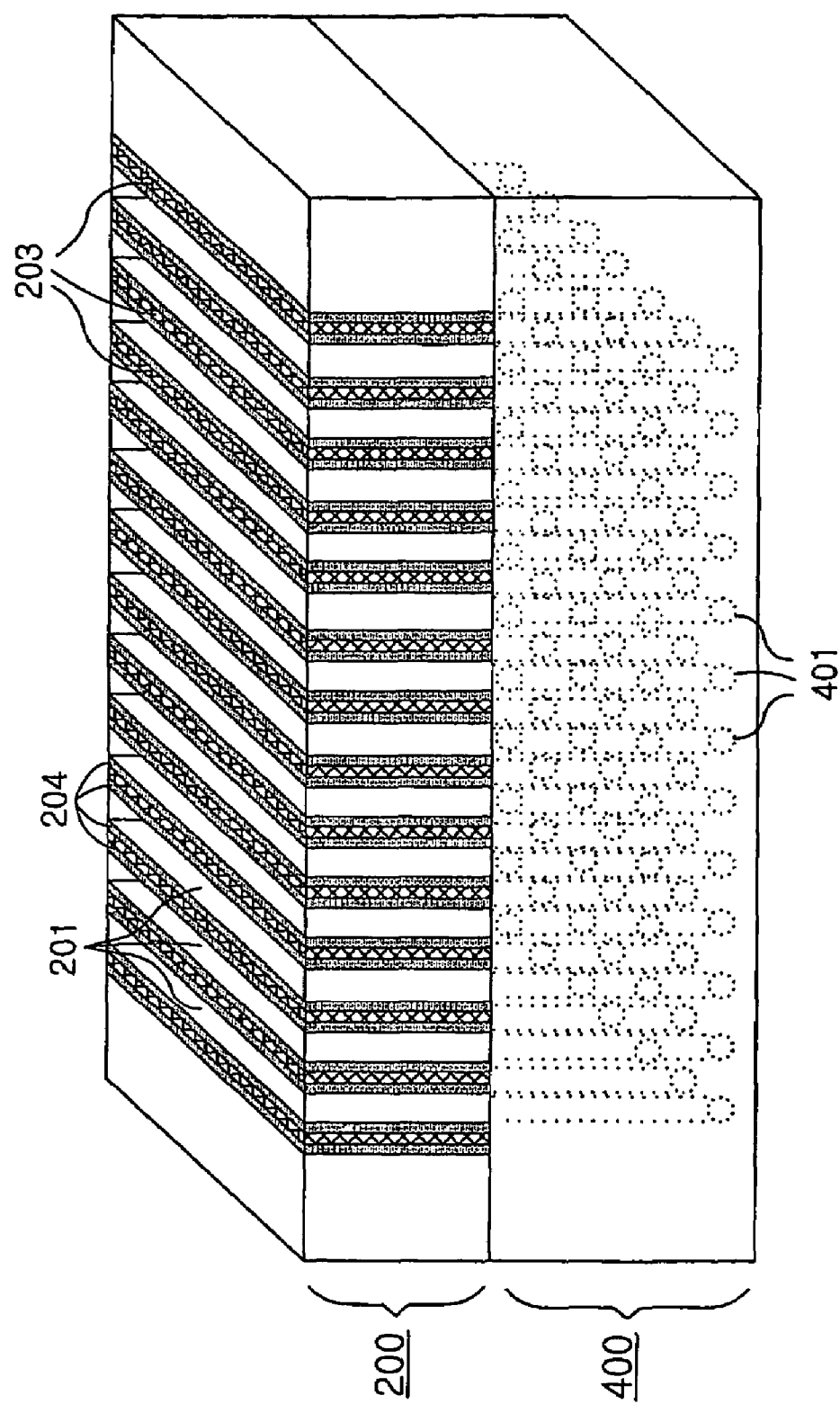
FIG. 4 is a perspective view showing preferred combination of a plasma limiter and a collimator used in the neutral particle beam processing apparatus in accordance with the present invention.

FIG. 4 is a perspective view showing a preferred combination of the plasma limiter and the collimator. The plasma limiter 200 in FIG. 4 has slits formed between flat panels 204 formed of ceramic, and the collimator 400 has holes at a position corresponding to the slits 201 of the plasma limiter 200. The slits 201 formed in the plasma limiter 200 improve the penetrating efficiency of the neutral particles, and the plasma ions and the electrons are additionally interrupted from passing through the slits 201 by the impressing magnetic field created by the magnetic 203. And holes 401 formed in the collimator 400 improve the directionality of the neutral particles. Interference by the plasma ions and the electrons is effectively excluded by the combination, and the neutral particles having collimated directionality perform surface treatment of the substrate. The neutral particles with improved directionality by the combination can be usefully applicable to lithography. For instance, the neutral particle beams can be applied to photo-resist removal on a substrate 301 with a stencil mask. Meanwhile, although the plasma limiter and the collimator are presented as a hexahedron shape in FIG. 4, it can be changed to various shapes such as cylindrical or oval shape.

As described, it should be evident that the present invention can be implemented through a variety of configurations in the aforementioned technical field without affecting, influencing or changing its spirit and scope of the invention. Therefore, it is to be understood that the examples and applications illustrated herein is intended to be in the nature of description rather than of limitation. Furthermore, the meaning, scope and higher conceptual understandings of the present patent application as well as modifications and variations that arise from thereof should be understood to be extensions to this current application.

The invention claimed is:

1. A neutral particle beam processing apparatus comprising a plasma discharging space inside which processing gases are converted into plasma ions through a plasma discharge, a heavy metal plate which converts the plasma ions into neutral particles through collisions, a plasma limiter which prevents plasma ions and electrons from passing through and allows the neutral particles produced by collisions of the plasma ions with the heavy metal plate to pass through, and a treating housing inside which a substrate to be treated is located, wherein the plasma discharging space is sandwiched between the heavy metal plate and the plasma limiter.

2. The neutral particle beam processing apparatus as set forth in claim 1, wherein the plasma limiter has holes or slits that selectively allows the neutral particles to pass through the plasma limiter while interrupting plasma ions and electrons from passing through.

3. The neutral particle beam processing apparatus as set forth in claim 2, wherein the plasma limiter further comprises a member selected from a magnetic unit to impress magnetic field and an electric unit to impress electric field to the holes or slits.

4. The neutral particle beam processing apparatus as set forth in claim 1, wherein a heavy metal plate is installed above the plasma discharging space and the plasma limiter is located below the plasma discharging space, and the plasma ions generated in the plasma discharging space are directed to the heavy metal plate to which a bias voltage is applied and collide with the heavy metal plate to produce neutral particles and then the produced neutral particles enter into the plasma limiter.

5. The neutral particle beam processing apparatus as set forth in claim 1, further comprising a collimator, between the plasma limiter and the treating housing, to collimate the neutral particles which had passed through the plasma limiter.

6. The neutral particle beam processing apparatus as set forth in claim 5, wherein the collimator has holes to collimate the neutral particles.

7. A neutral particle beam processing apparatus, comprising:
   a) a reaction chamber with an opened lower part, comprising an inner space, an gas inlet port and an gas outlet port installed at a side of the reaction chamber, and a heavy metal plate, wherein the inner space of the reaction chamber is a plasma discharging space and the heavy metal plate is installed above the plasma discharging space, processing gases introduced into the plasma discharging space through the gas inlet port being converted into plasma ions through a plasma discharge and then the plasma ions being converted into neutral particles by collisions with the heavy metal plate;
   b) a plasma limiter located below the reaction chamber comprising holes or slits to pass the neutral particles through while interrupting the plasma ions and electrons from passing through, wherein the plasma limiter has holes or slits that selectively allows neutral particles to pass through the plasma limiter while interrupting plasma ions and electrons from passing through; and
   c) a treating housing located below the plasma limiter inside which a substrate to be treated with the neutral particles is located.

8. The neutral particle beam processing apparatus as set forth in claim 7, wherein the plasma limiter further comprises a member selected from a magnetic unit to impress magnetic field and an electric unit to impress electric field to the holes or slits.

9. The neutral particle beam processing apparatus as set forth in claim 7, further comprising a collimator, between the plasma limiter and the treating housing, to collimate the neutral particles which had passed through the plasma limiter.

10. The neutral particle beam processing apparatus as set forth in claim 9, wherein the collimator has holes to collimate the neutral particles.

11. The neutral particle beam processing apparatus as set forth in claim 7, wherein a bias voltage is applied to the heavy metal plate to direct the plasma ions to the heavy metal plate.

12. A surface treatment method with neutral particles, which comprises the steps of:
   a) arranging a plasma discharging space inside which processing gases are converted into plasma ions through a plasma discharge, between a heavy metal plate which converts the plasma ions into neutral particles through collisions and a plasma limiter which prevents plasma ions and electrons from passing through and allows the neutral particles produced by collisions of the plasma ions with the heavy metal plate to pass through;
   b) converting the processing gases into plasma through a plasma discharging in the plasma discharging space;
   c) directing the plasma ions generated in the plasma discharging space to the heavy metal plate with aid of a bias voltage applied to the heavy metal plate, thereby producing neutral particles by collisions of the plasma ions with the heavy metal plate;
   d) passing the neutral particles reflected by the heavy metal plate via the plasma discharging space through the plasma limiter; and,
   e) contacting the neutral particles, which had passed through the plasma limiter, with a surface of a substrate to achieve surface treatment of a substrate.

13. The surface treatment method as set forth in claim 12, wherein the plasma limiter has holes or slits to selectively pass neutral particles through and interrupt plasma ions and electrons from passing through.

14. The surface treatment method as set forth in claim 13, wherein the plasma limiter further comprises a member selected from a magnetic unit to impress magnetic field and an electric unit to impress electric field to the holes or slits.

15. The surface treatment method as set forth in claim 12, further comprising, between d) step and e) step, passing the neutral particles which had passed through the plasma limiter through a collimator with holes to collimate the neutral particles.

* * * * *